United States Patent
You

(10) Patent No.: US 8,254,188 B2
(45) Date of Patent: Aug. 28, 2012

(54) SEMICONDUCTOR MEMORY DEVICE AND DELAY LOCKED LOOP CONTROL METHOD THEREOF

(75) Inventor: Min-Young You, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 587 days.

(21) Appl. No.: 12/429,381

(22) Filed: Apr. 24, 2009

(65) Prior Publication Data
US 2010/0142296 A1 Jun. 10, 2010

(30) Foreign Application Priority Data
Dec. 9, 2008 (KR) .................. 10-2008-0124763

(51) Int. Cl.
*G11C 7/00* (2006.01)
(52) U.S. Cl. ........................ 365/194; 327/158
(58) Field of Classification Search .................. None
See application file for complete search history.

(56) References Cited

U.S. PATENT DOCUMENTS

| | | | | |
|---|---|---|---|---|
| 6,266,294 | B1* | 7/2001 | Yada et al. | 365/233.14 |
| 6,813,197 | B2* | 11/2004 | Park | 365/233.14 |
| 6,901,013 | B2* | 5/2005 | Jones et al. | 365/194 |
| 7,388,415 | B2* | 6/2008 | Lee | 327/158 |
| 7,676,686 | B2* | 3/2010 | Ku et al. | 713/600 |

FOREIGN PATENT DOCUMENTS

| JP | 2000-021165 | 1/2000 |
|---|---|---|
| KR | 1020070082322 A | 8/2007 |

OTHER PUBLICATIONS

JEDEC standard JESD79F, "Double Data Rate (DDR) SDRAM," published Feb. 2008. p. 6.*
Yang, "Delay-Locked Loops—An Overview," 2003, IEEE Press, from Phase-Locking in High-Perfomance Systems. pp. 13-22.*
Notice of Preliminary Rejection issued from Korean Intellectual Property Office on Feb. 23, 2010.

* cited by examiner

*Primary Examiner* — Alexander Sofocleous
(74) *Attorney, Agent, or Firm* — IP & T Group LLP

(57) ABSTRACT

A semiconductor memory device includes a mode control circuit configured to output a DLL on signal which is periodically activated during a specific mode; and a DLL circuit configured to delay and lock a clock to generate a DLL clock, and to be periodically turned on in response to the DLL on signal during the start of the specific mode.

24 Claims, 5 Drawing Sheets

SEMICONDUCTOR MEMORY DEVICE AND DELAY LOCKED LOOP CONTROL METHOD THEREOF

CROSS-REFERENCE TO RELATED APPLICATIONS

The present invention claims priority of Korean patent application number 10-2008-0124763, filed on Dec. 9, 2008, the disclosure of which is incorporated by reference herein in its entirety.

BACKGROUND OF THE INVENTION

The present invention relates to a semiconductor memory device, and more particularly, to a semiconductor memory device including a delay locked loop (DLL) circuit and a DLL control method thereof.

Generally, since a high-speed semiconductor memory device processes data in synchronization with an external clock, it delays the external clock through a DLL circuit to generate an internal clock and controls the data to be outputted in accurate synchronization with the edge of the external clock.

The DLL circuit does not operate in a specific mode, i.e., a power mode or a self refresh mode, and then starts to operate after the end of the specific mode.

However, when a conventional power supply of a semiconductor memory device is unstable, a timing between a clock (hereinafter, referred to as a DLL clock) outputted from a DLL circuit before the start of the specific mode and a DLL clock after the end of the specific mode may be mismatched. Due to the timing mismatch of the DLL clock, failure may occur in the semiconductor memory device.

SUMMARY OF THE INVENTION

Embodiments of the present invention are directed to providing a semiconductor memory device, which reduces the timing mismatch between a DLL clock before the start of a specific mode where a DLL circuit is turned off and a DLL clock after the end of the specific mode.

In accordance with an aspect of the present invention, there is provided a semiconductor memory device including: a mode control circuit configured to output a delay locked loop (DLL) on signal which is periodically activated during a specific mode; and a DLL circuit configured to delay and lock a clock to generate a DLL clock, and to be periodically turned on in response to the DLL on signal during the start of the specific mode.

In accordance with another aspect of the present invention, there is provided a semiconductor memory device including: a division circuit configured to divide an input clock to output a divided clock during a specific mode; an oscillation circuit configured to count the divided clock to output an oscillation signal; a control circuit configured to output a DLL on signal in response to the oscillation signal; and a DLL circuit configured to delay and lock an external clock to generate a DLL clock, and to be turned on in response to the DLL on signal during the start of the specific mode.

The division circuit may include a first division unit configured to divide the clock; and a plurality of second division units connected to the first division unit in series, wherein each of the second division units may divide a division clock outputted from a previous division unit, and output a further divided clock and output a further divided clock.

In accordance with another aspect of the present invention, there is provided a delay locked loop (DLL) controlling method including: dividing a clock to output a divided clock upon a specific mode where a DLL circuit is maintained in a turn-off state; counting the divided clock to output an oscillation signal; and outputting a DLL on signal which is periodically activated in synchronization with the divided clock by using the oscillation signal, wherein the DLL circuit is periodically turned on by the DLL on signal in the specific mode.

In accordance with another aspect of the present invention, there is provided a semiconductor memory device including: an oscillation signal generating unit configured to divide an input clock to output an oscillation signal, a control circuit configured to output a DLL-on signal in response to the oscillation signal; and a DLL circuit configured to delay and lock an external clock to generate a DLL clock, and to be turned on in response to the DLL-on signal during the start of the specific mode.

DESCRIPTION OF SPECIFIC EMBODIMENTS

Other objects and advantages of the present invention can be understood by the following description, and become apparent with reference to the embodiments of the present invention.

A semiconductor memory device in accordance with embodiments of the present invention turns on a DLL circuit after the start of a specific mode where the DLL circuit is turned off, and reduces the timing mismatch between a DLL clock before the start of the specific mode and a DLL clock after the end of the specific mode.

Figure 1:
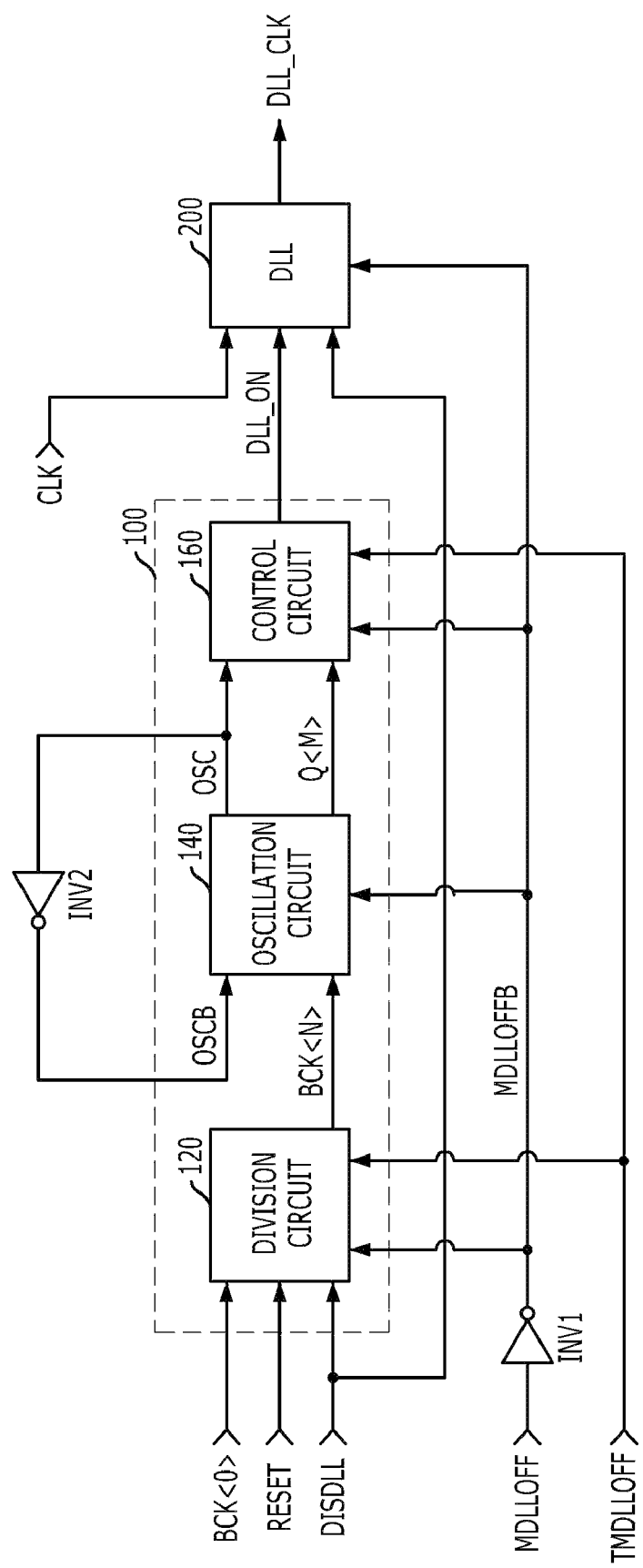
FIG. 1 is a block diagram of a semiconductor memory device in accordance with an embodiment of the present invention.

FIG. 1 is a block diagram of a semiconductor memory device in accordance with an embodiment of the present invention. Referring to FIG. 1, the semiconductor memory device in accordance with an embodiment of the present invention includes a mode control circuit 100 and a DLL circuit 200.

The mode control circuit 100 may include a division circuit 120, an oscillation circuit 140 and a control circuit 160.

The division circuit 120 divides an input clock BCK<0> to output a division clock BCK<N>, where N is a natural number, in response to a reset signal RESET, a DLL off signal DISDLL, an inverted mode signal MDLLOFFB and a test mode signal TMDLLOFF.

In this case, the DLL off signal DISDLL is a signal for turning off the DLL circuit 200 and is generated in an extension mode register set (EMRS).

A first inverter INV1 inverts a mode signal MDLLOFF and outputs the inverted mode signal MDLLOFFB. The mode signal MDLLOFF controls the start/end of a specific mode where the DLL circuit 200 is turned on. The specific mode starts when a clock enable signal CKE is deactivated, and corresponds to a power down mode or a self refresh mode.

The test mode signal TMDLLOFF is a signal provided for a test in the specific mode, and is generated using a test mode or a fuse.

The input clock BCK<0> is toggled irrespective of an operation mode in the semiconductor memory device, and corresponds to an external clock CLK or an internal clock synchronized with the external clock CLK.

Figure 2:
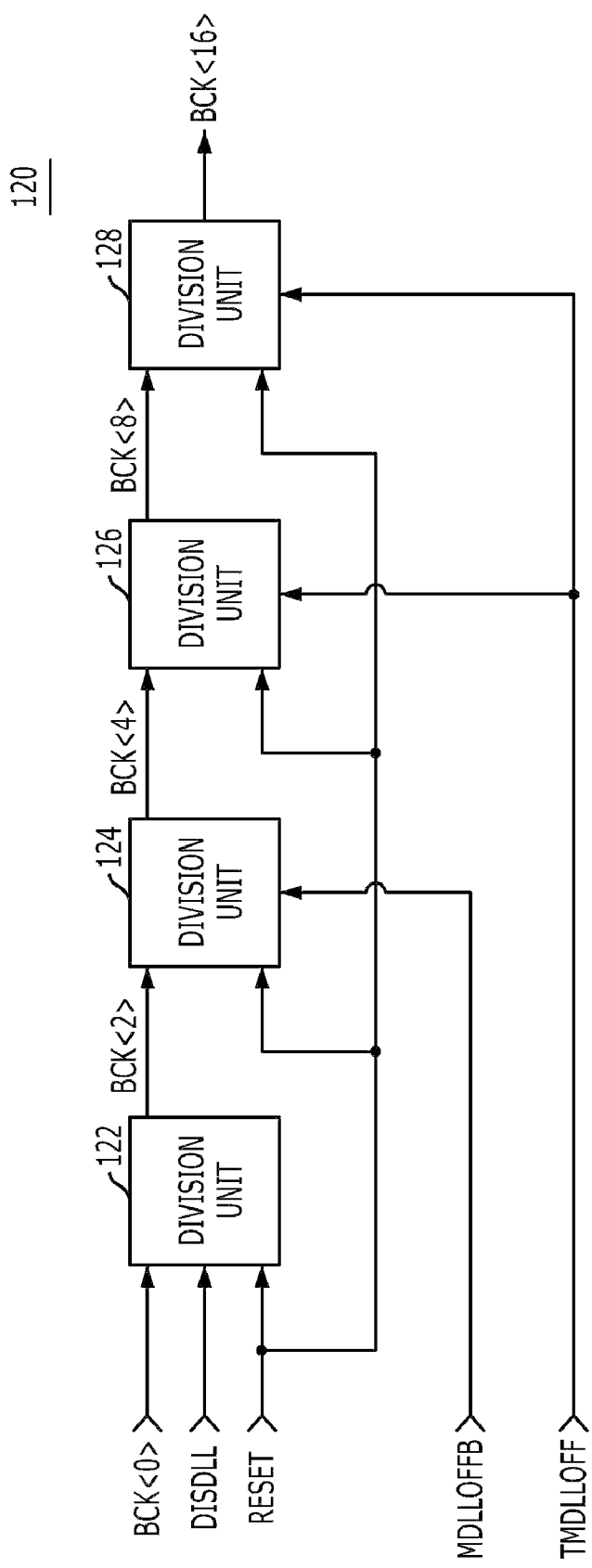
FIG. 2 is a circuit diagram of a division circuit of FIG. 1 in accordance with an embodiment of the present invention.
Figure 3:
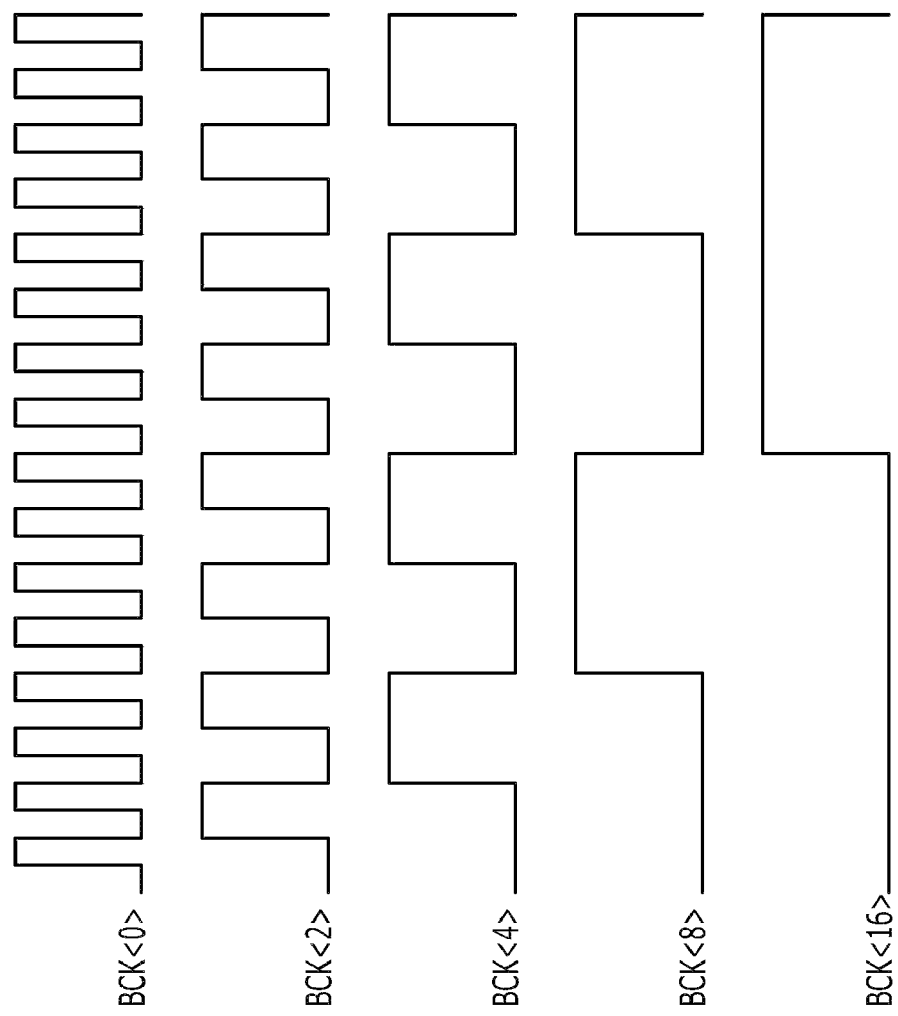
FIG. 3 is a waveform diagram illustrating output signals of division units of FIG. 2 in accordance with an embodiment of the present invention.

FIG. 2 is a circuit diagram of the division circuit of FIG. 1 in accordance with an embodiment of the present invention, and FIG. 3 is a waveform diagram illustrating output signals of division units of FIG. 2 in accordance with an embodiment of the present invention.

It is assumed that the division circuit 120 includes first, second, third and fourth division units 122, 124, 126 and 128, which are coupled in series and respectively divide input signals of them by two in FIGS. 2 and 3.

Referring to FIGS. 2 and 3, the first division unit 122 divides the input clock BCK<0> to output the divided input clock as a first division clock BCK<2>. The division unit 122 is reset in response to the reset signal RESET, and is turned off in response to the DLL off signal DISDLL.

The second division unit 124 is turned on in response to the inverted mode signal MDLLOFFB and divides the first division clock BCK<2> to output the divided first division clock as a second division clock BCK<4>. The division unit 124 is reset in response to the reset signal RESET.

The third division unit 126 is turned on in response to the test mode signal TMDLLOFF and divides the second division clock BCK<4> to output the divided second division clock as a third division clock BCK<8>. The fourth division unit 128 is turned on in response to the test mode signal TMDLLOFF and divides the third division clock BCK<8> to output the divided third division clock as a fourth division clock BCK<16>. The third and fourth division units 126 and 128 are reset in response to the reset signal RESET.

The division circuit 120 shown in FIG. 2 does not operate when the DLL circuit 200 is turned off in response to the DLL off signal DISDLL instead of the specific mode, and divides the input clock BCK<0> in response to the test mode signal TMDLLOFF upon start of the specific mode.

As illustrated in FIG. 3, each of the first, second, third and fourth division units 122, 124, 126 and 128 divides a clock inputted to each of the first, second, third and fourth division units 122, 124, 126 and 128 by two. That is, the division circuit 120 including the first, second, third and fourth division units 122, 124, 126 and 128 divides the clock BCK<0> by sixteen to output the fourth division clock BCK<16>.

In FIG. 1, the fourth division clock BCK<16> outputted from the division circuit 120 is inputted to the oscillation circuit 140, and the oscillation circuit 140 counts the fourth division clock BCK<16> to output an oscillation signal OSC in response to the inverted mode signal MDLLOFFB. Furthermore, the oscillation circuit 140 receives an inverted oscillation signal OSCB through a second inverter INV2 for an initial operation.

Figure 4:
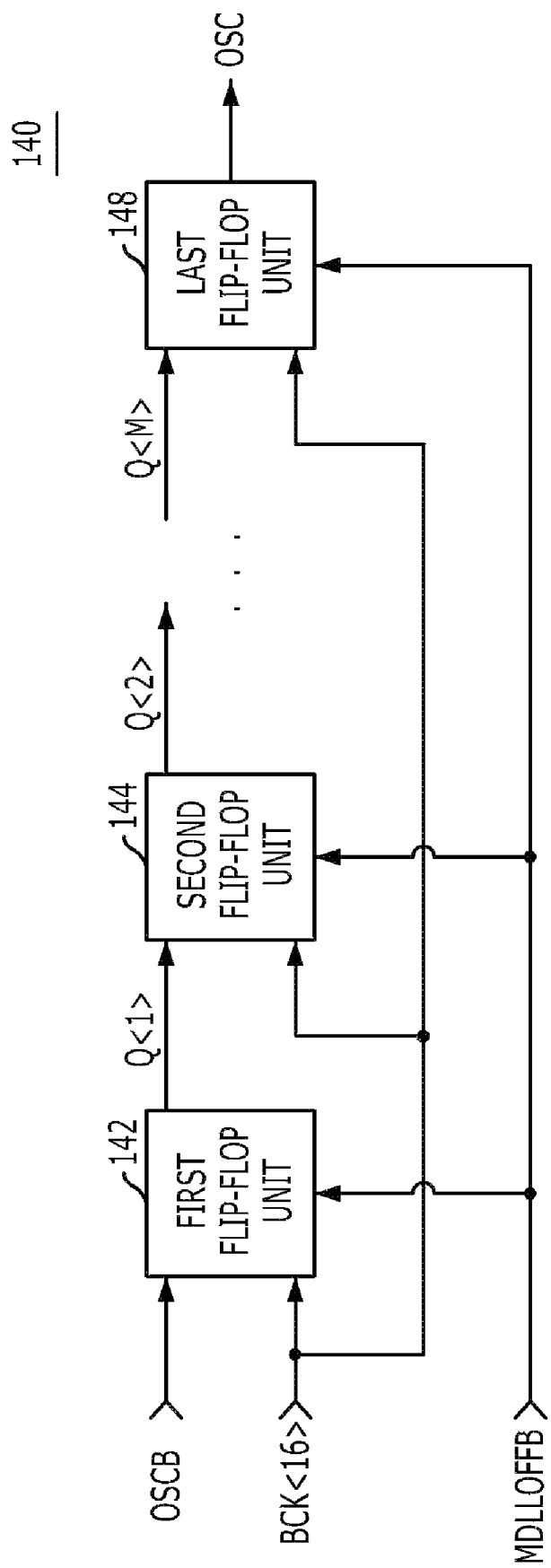
FIG. 4 is a circuit diagram of an oscillation circuit of FIG. 1 in accordance with an embodiment of the present invention.

FIG. 4 is a circuit diagram of the oscillation circuit of FIG. 1 in accordance with an embodiment of the present invention. Referring to FIG. 4, the oscillation circuit 140 includes a plurality of flip-flop units 142, 144 and 148 connected in serial.

A first flip-flop unit 142 is turned off in response to the inverted mode signal MDLLOFFB, and outputs a first count signal Q<1> corresponding to the state of the inverted oscillation signal OSCB synchronized with the edge of the clock BCK<16>.

A second flip-flop unit 144 and a last flip-flop 148 are turned on/off in response to the inverted mode signal MDLLOFFB, and output the oscillation signal OSC or second and last count signals Q<2:M>, where M is a natural number greater than two, corresponding to the output state of a previous flip-flop unit in synchronization with the edge of the fourth division clock BCK<16>.

The flip-flop unit 142 of the oscillation circuit 140 having such a configuration, for example, outputs the first count signal Q<1> having a high level state from the initial rising/falling edge of the fourth division clock BCK<16> if the inverted oscillation signal OSCB has an initial high level. Subsequently, the second and last flip-flop units 144 and 148 operate in sequence. The oscillation signal OSC is outputted from the last flip-flop unit 148, and the first count signal Q<1> is shifted to a low level in synchronization with the rising/falling edge of the fourth division clock BCK<16> next to the output of the oscillation signal OSC.

As shown in FIG. 1, the last count signal Q<M> and the oscillation signal OSC outputted from the oscillation circuit 140 are inputted to the control circuit 160. The control circuit 160 outputs a DLL-on signal DLL_ON in response to the count signal Q<M>, the oscillation signal OSC, the inverted mode signal MDLLOFFB and the test mode signal TMDLLOFF.

Figure 5:
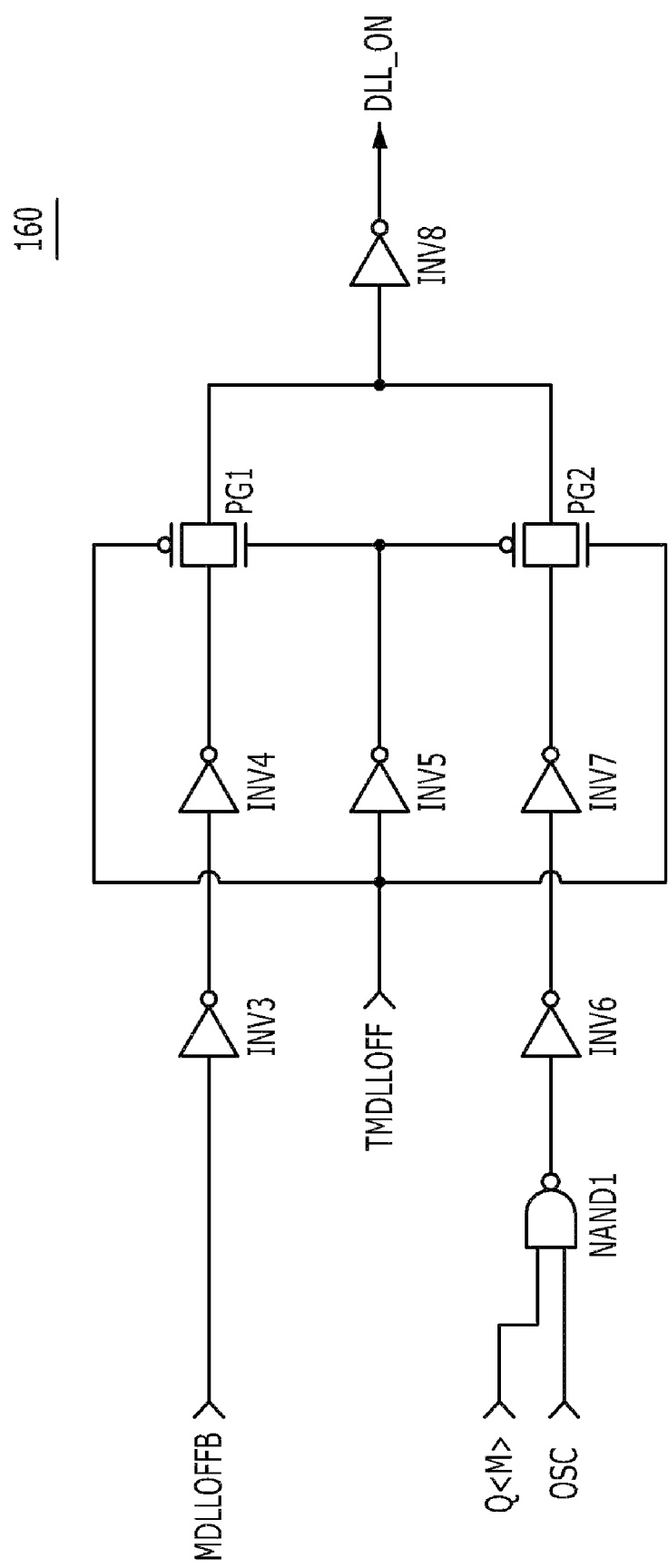
FIG. 5 is a circuit diagram of a control circuit of FIG. 1 in accordance with an embodiment of the present invention.

FIG. 5 is a circuit diagram of the control circuit of FIG. 1 in accordance with an embodiment of the present invention. Referring to FIG. 5, the control circuit 160 includes a third inverter INV3, a fourth inverter INV4, a fifth inverter INV5, a NAND gate NAND1, a sixth inverter INV6, a seventh inverter INV7, a first pass gate PG1, a second pass gate PG2 and an eighth inverter INV8.

The third inverter INV3 inverts the inverted mode signal MDLLOFFB. The fourth inverter INV4 inverts the output signal of the inverter INV3. The fifth inverter INV5 inverts the test mode signal TMDLLOFF. The NAND gate NAND1 performs a NAND operation on the count signal Q<M> and the oscillation signal OSC. The sixth inverter INV6 inverts the output signal of the NAND gate NAND1. The seventh inverter INV7 inverts the output signal of the sixth inverter INV6. The first pass gate PG1 passes the output signal of the inverter INV4 in response to the test mode signal TMDLLOFF and the output signal of the inverter INV5. The second pass gate PG2 passes the output signal of the inverter INV7 in response to the test mode signal TMDLLOFF and the output signal of the inverter INV5. The eighth inverter INV8 inverts the output signals of the pass gates PG1 and PG2 to output the DLL on signal DLL_ON.

The control circuit 160 outputs the DLL on signal DLL_ON having a state corresponding to the inverted mode signal MDLLOFFB or the output signal of the NAND gate NAND1 in response to the state of the test mode signal TMDLLOFF.

That is, in a case where the specific mode is not entered, since the inverted mode signal MDLLOFFB has a high level and the test mode signal TMDLLOFF has a low level, the DLL on signal DLL_ON is deactivated to a low level.

In a case where the specific mode is entered, since the inverted mode signal MDLLOFFB has a low level and the test mode signal TMDLLOFF has a high level, the DLL on signal DLL_ON has an inverted logic level of the signal logically NAND-combined by the count signal Q<M> and the oscillation signal OSC. In this case, the DLL on signal DLL_ON is periodically activated to a high level in synchronization with the count signal Q<M>.

For reference, the NAND operation is performed on the count signal Q<M> and the oscillation signal OSC in order to prevent the DLL on signal DLL_ON from being activated due to glitch.

In FIG. 1, the DLL on signal DLL_ON outputted through the control circuit 160 is inputted to the DLL circuit 200. In the specific mode where the inverted mode signal MDL-LOFFB has a low level, only when the DLL on signal DLL_ON is activated, the DLL circuit 200 delays and locks the external clock CLK to output the DLL clock DLL_CLK. For reference, the DLL circuit 200 is turned off in response to the DLL off signal DISDLL.

As described above, the semiconductor memory device in accordance with the embodiments of the present invention periodically turns on the DLL circuit upon the specific mode where the DLL circuit is turned off, and thus can almost identically match the timing of the DLL clock upon the end of the specific mode with the timing before the start of the specific mode.

Particularly, if the power supply of the semiconductor memory device is unstable, when the DLL circuit is maintained in a turned-off state upon the start of the power down mode, the timing difference between the DLL clock before the start of the power down mode and the DLL clock after the end of the power down mode can occur.

However, the semiconductor memory device in accordance with the embodiments of the present invention controls the DLL circuit to periodically be turned on after the start of the power down mode, and thus can prevent failure by decreasing timing mismatch.

The semiconductor memory device in accordance with the embodiments of the present invention periodically turns on the DLL circuit upon the start of the specific mode where the DLL circuit is turned off, thereby reducing the timing mismatch between the DLL clock before the start of the specific mode and the DLL clock after the end of the specific mode.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a mode control circuit configured to output a delay locked loop (DLL)-on signal which is periodically activated in response to an activation of a test mode signal during a specific mode; and
    a DLL circuit configured to delay and lock a clock to generate a DLL clock and further configured to be periodically turned on in response to the DLL-on signal during the start of the specific mode.

2. The semiconductor memory device of claim 1, wherein the specific mode is entered when a clock enable signal is deactivated.

3. The semiconductor memory device of claim 2, wherein the specific mode is a power down mode.

4. The semiconductor memory device of claim 1, wherein the mode control circuit is configured to output the DLL-on signal which is activated in synchronization with a period of the clock.

5. The semiconductor memory device of claim 4, wherein the mode control circuit is configured to divide the clock and count a divided clock to output the DLL-on signal activated in accordance with a signal outputted as a result of the count.

6. The semiconductor memory device of claim 4, wherein the clock is the external clock or an internal clock synchronized with the external clock.

7. A semiconductor memory device, comprising:
    a division circuit configured to divide an input clock to output a divided clock during a specific mode;
    an oscillation circuit configured to count the divided clock to output an oscillation signal;
    a control circuit configured to output a delay locked loop (DLL)-on signal in response to the oscillation signal and an activation of a test mode signal; and
    a DLL circuit configured to delay and lock an external clock to generate a DLL clock, and to be turned on in response to the DLL-on signal during the start of the specific mode.

8. The semiconductor memory device of claim 7, wherein the specific mode is entered when a clock enable signal is deactivated.

9. The semiconductor memory device of claim 8, wherein the specific mode is a power down mode.

10. The semiconductor memory device of claim 7, wherein the division circuit includes:
    a first division unit configured to divide the clock; and
    a plurality of second division units coupled to the first division unit in series,
    wherein each of the second division units is configured to divide a division clock outputted from a previous division unit and output a further divided clock.

11. The semiconductor memory device of claim 7, wherein the division circuit is turned on in response to a signal for controlling the start of the specific mode, and is turned off in response to a signal for controlling turn-off of the DLL circuit.

12. The semiconductor memory device of claim 11, wherein the signal for controlling the turn-off of the DLL circuit is a signal which is generated in an extension mode register set.

13. The semiconductor memory device of claim 7, wherein the oscillation circuit includes a plurality of flip-flop units connected in series to count the divided clock, wherein the oscillation signal is outputted from a last one of the flip-flop units.

14. The semiconductor memory device of claim 13, wherein each of the flip-flop units is configured to output an output signal corresponding to a signal state having a phase opposite to a phase of the oscillation signal or an output state of a previous flip-flop unit in synchronization with an edge of the divided clock.

15. The semiconductor memory device of claim 13, wherein the flip-flop units are configured to be reset in response to a signal for controlling the start of the specific mode.

16. The semiconductor memory device of claim 7, wherein the control circuit is configured to select one of the oscillation signal and a signal for controlling the start of the specific mode in response to the test mode signal, and output the DLL-on signal corresponding to the selected signal state.

17. A method for controlling a delay locked loop (DLL), comprising:
    dividing a clock to output a divided clock during a specific mode where a DLL circuit is maintained in a turn-off state;
    counting the divided clock to output an oscillation signal; and
    outputting, in response to an activation of a test mode signal, a DLL on signal which is periodically activated in synchronization with the divided clock by using the oscillation signal,
    wherein the DLL circuit is periodically turned on by the DLL-on signal during the specific mode.

18. The method of claim 17, wherein the specific mode is entered when a clock enable signal is deactivated.

19. The method of claim 18, wherein the specific mode is a power down mode.

20. The method of claim 17, wherein the clock is an external clock or an internal clock synchronized with the external clock.

21. A semiconductor memory device, comprising:
an oscillation signal generating circuit configured to divide an input clock to output an oscillation signal;
a control circuit configured to output a delay locked loop (DLL)-on signal in response to the oscillation signal and an activation of a test mode signal; and
a DLL circuit configured to delay and lock an external clock to generate a DLL clock, and to be turned on in response to the DLL-on signal during the start of the specific mode.

22. The semiconductor memory device of claim 21, wherein the oscillation signal generating circuit includes:
a first division unit configured to divide the clock; and
a plurality of second division units coupled to the first division unit in series,
wherein each of the second division units is configured to divide a division clock outputted from a previous division unit, and output the divided clock.

23. The semiconductor memory device of claim 21, wherein the oscillation signal generating circuit is configured to be turned on in response to a signal for controlling the start of the specific mode, and turned off in response to a signal for controlling turn-off of the DLL circuit.

24. The semiconductor memory device of claim 21, wherein the control circuit is configured to select one of the oscillation signal and a signal for controlling the start of the specific mode in response to the test mode signal, and output the DLL-on signal corresponding to the selected signal state.

* * * * *